US012648294B2

(12) United States Patent
Lee et al.

(10) Patent No.: US 12,648,294 B2

(45) Date of Patent: Jun. 2, 2026

(54) LIGHT EMITTING ELEMENT AND DISPLAY DEVICE INCLUDING THE SAME

(71) Applicant: LG Display Co., Ltd., Seoul (KR)

(72) Inventors: Yu Jeong Lee, Paju-si (KR); Wook Song, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 833 days.

(21) Appl. No.: 18/086,368

(22) Filed: Dec. 21, 2022

(65) Prior Publication Data

US 2023/0217674 A1 Jul. 6, 2023

(30) Foreign Application Priority Data

Dec. 31, 2021 (KR) ........................ 10-2021-0194758

(51) Int. Cl.

| | |
|---|---|
| ***H10K 50/15*** | (2023.01) |
| ***H10K 50/12*** | (2023.01) |
| ***H10K 50/13*** | (2023.01) |
| ***H10K 50/16*** | (2023.01) |
| ***H10K 50/18*** | (2023.01) |

(52) U.S. Cl.

CPC ............ *H10K 50/15* (2023.02); *H10K 50/12* (2023.02); *H10K 50/13* (2023.02); *H10K 50/16* (2023.02); *H10K 50/181* (2023.02)

(58) Field of Classification Search

CPC ........ H10K 50/15; H10K 50/12; H10K 50/13; H10K 50/16; H10K 50/181; H10K 50/155; H10K 2101/30; H10K 50/19; H10K 50/11; H10K 85/6572

See application file for complete search history.

(56) References Cited

U.S. PATENT DOCUMENTS

| | | | |
|---|---|---|---|
| 10,483,474 B2 | 11/2019 | Kim | |
| 10,673,006 B2 | 6/2020 | Kim et al. | |
| 2018/0033990 A1 | 2/2018 | Kim | |
| 2019/0088896 A1 | 3/2019 | Kim et al. | |
| 2020/0203649 A1 * | 6/2020 | Kwon | H10K 59/80516 |

FOREIGN PATENT DOCUMENTS

| | | |
|---|---|---|
| KR | 10-2013-0025854 A | 3/2013 |
| KR | 10-2016-0067667 A | 6/2016 |
| KR | 10-2018-0013604 A | 2/2018 |
| KR | 10-2019-0033117 A | 3/2019 |

OTHER PUBLICATIONS

Yuan, Jiakun, et al. "Highly efficient charge generation and injection in HAT-CN/TAPC heterojunction for high efficiency tandem organic light-emitting diodes." Organic Electronics 83 (2020): 105745. (Year: 2020).*

Korean Intellectual Property Office, Office Action, Korean Patent Application No. 10-2021-0194758, Dec. 10, 2024, 18 pages.

* cited by examiner

*Primary Examiner* — Dawn L Garrett

(74) *Attorney, Agent, or Firm* — Fenwick & West LLP

(57) ABSTRACT

Disclosed are a light emitting element and a display device including the same, wherein a hole generation layer is further provided between a hole transport layer and an emission layer, in addition to an electron blocking layer, in order to control the speed of electrons and holes introduced into the emission layer, whereby it is possible to prevent accumulation of carriers at the electron blocking layer or the hole transport layer, and therefore it is possible to reduce turn-on voltage, to maintain uniform efficiency irrespective of change in current density, to prevent defects at specific gradation, and to increase lifetime.

21 Claims, 15 Drawing Sheets

LIGHT EMITTING ELEMENT AND DISPLAY DEVICE INCLUDING THE SAME

CROSS-REFERENCE TO RELATED APPLICATION

This application claims the benefit of Korean Patent Application No. 10-2021-0194758, filed on Dec. 31, 2021, which is hereby incorporated by reference as if fully set forth herein.

BACKGROUND OF THE INVENTION

Field of the Invention

The present disclosure relates to a light emitting element, and more particularly to a light emitting element configured such that the construction between an emission layer and a hole transport layer of the light emitting element is changed, thereby preventing an increase in driving voltage and increasing lifetime, and a display device including the same.

Discussion of the Related Art

With recent approach to a full-scale information age, displays capable of visually expressing electrical information signals have been rapidly developed. Correspondingly, various display devices having excellent performance, such as slimness, light weight, and low power consumption, have been developed and have rapidly replaced a conventional cathode ray tube (CRT).

Among the display devices, a light emitting display device having a light emitting element in a display panel has been considered as a competitive application in order to achieve compaction of the display device and vivid color display without necessity of a separate light source.

In a structure having a plurality of stacks, when an inorganic material is mainly used at the interface of one of the stacks, i.e. at the interface at which an electrode faces the stack or at the interface at which a charge generation layer faces the stack, there is electron dominance in an initial state or in a low gradation (low current density driving) state, whereby the difference in mobility between holes and electrons may occur, and therefore hole accumulation may occur between a hole transport layer and an emission layer of the stack.

The difference in mobility between holes and electrons in the low gradation state may be observed as poor low gradation visibility, and hole accumulation due to change in current density may be a main cause by which lifetime of the light emitting display device is reduced.

SUMMARY OF THE INVENTION

Accordingly, the present disclosure is directed to a light emitting element and a display device including the same that substantially obviate one or more problems due to limitations and disadvantages of the related art.

It is an object of the present disclosure to provide a light emitting element configured such that a hole generation layer that withdraws electrons to generate holes is further provided between a hole transport layer and an emission layer in order to control the speed of electrons and holes introduced into the emission layer, whereby it is possible to prevent accumulation of carriers at an electron blocking layer or the hole transport layer, and therefore it is possible to reduce turn-on voltage, to maintain uniform efficiency irrespective of change in current density, to prevent defects at specific gradation, and to increase lifetime, and a display device including the same.

In a light emitting element according to the present disclosure and a display device including the same, a hole generation layer is further provided between a hole transport layer and an emission layer, in addition to an electron blocking layer, in order to control the speed of electrons and holes introduced into the emission layer, whereby it is possible to prevent accumulation of carriers at the electron blocking layer or the hole transport layer, and therefore it is possible to reduce turn-on voltage, to maintain uniform efficiency irrespective of change in current density, to prevent defects at specific gradation, and to increase lifetime.

To achieve these objects and other advantages and in accordance with the purpose of the invention, as embodied and broadly described herein, a light emitting element includes a first electrode and a second electrode opposite each other, at least one charge generation layer provided between the first electrode and the second electrode, and a first stack including a first emission layer provided between the first electrode and the charge generation layer, a hole transport unit including a hole transport layer, a hole generation layer, and an electron blocking layer sequentially provided between the first electrode and the first emission layer, and an electron transport layer provided between the first emission layer and the charge generation layer, wherein the hole generation layer includes an organic host and a p-type dopant, the organic host has a LUMO level and a HOMO level different respectively from the LUMO level and the HOMO level of the electron blocking layer by 1 eV or less, and the p-type dopant has a HOMO level of −9.0 eV or less.

In another aspect of the present disclosure, a display device includes a substrate having a plurality of subpixels, a transistor provided at each subpixel, and a light emitting element including a first electrode connected to the transistor at each subpixel, a second electrode opposite the first electrode, and a plurality of stacks divided by at least one charge generation layer between the first electrode and the second electrode, wherein a first stack of the light emitting element includes a first emission layer provided between the first electrode and the charge generation layer, a hole transport unit including a hole transport layer, a hole generation layer, and an electron blocking layer sequentially provided between the first electrode and the first emission layer, and an electron transport layer provided between the first emission layer and the charge generation layer, the hole generation layer includes an organic host and a p-type dopant, the organic host has a LUMO level and a HOMO level different respectively from the LUMO level and the HOMO level of the electron blocking layer by 1 eV or less, and the p-type dopant has a HOMO level of −9.0 eV or less.

In still another aspect of the present disclosure, a light emitting element comprises: a first electrode; a hole transport layer on the first electrode; a hole generation layer disposed directly on the hole transport layer; an electron blocking layer disposed directly on the hole generation layer; an emission layer on the electron blocking layer; an electron transport layer on the emission layer; and a second electrode on the electron transport layer, wherein the hole generation layer comprises an organic host and a p-type dopant, the organic host has a LUMO level and a HOMO level different from a LUMO level and a HOMO level, respectively, of the electron blocking layer by 1 eV or less, and the p-type dopant has a LUMO level different from the HOMO level of the electron blocking layer by 1 eV or less.

It is to be understood that both the foregoing general description and the following detailed description of the present disclosure are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1:
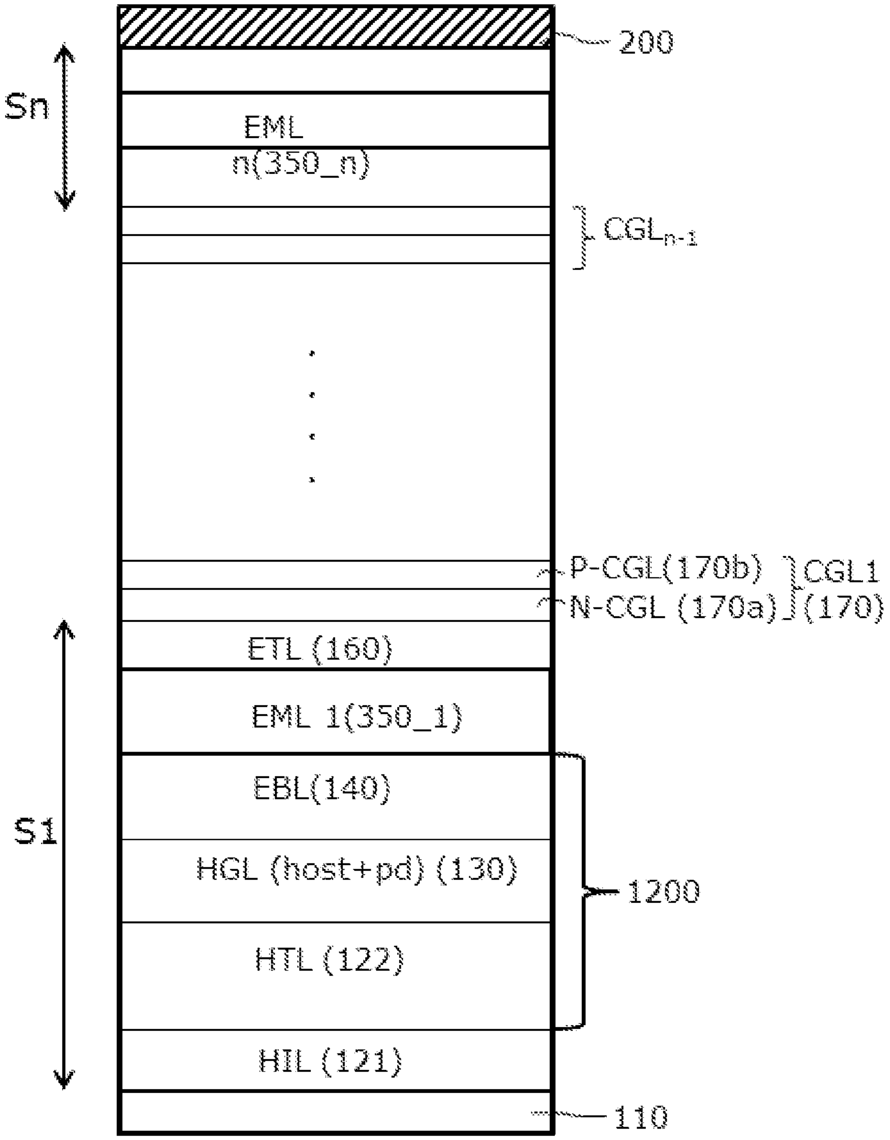
FIG. 1 is a sectional view schematically showing a light emitting element according to an embodiment of the present disclosure.

Reference will now be made in detail to preferred embodiments of the present invention, examples of which are illustrated in the accompanying drawings. Wherever possible, the same reference numbers will be used throughout the drawings to refer to the same or like parts. In the following description of the present invention, detailed descriptions of known functions and configurations incorporated herein will be omitted when the same may obscure the subject matter of the present invention. In addition, the names of elements used in the following description are selected in consideration of clarity of description of the specification, and may differ from the names of elements of actual products.

The shape, size, ratio, angle, number, and the like shown in the drawings to illustrate various embodiments of the present invention are merely provided for illustration, and the invention is not limited to the content shown in the drawings. Wherever possible, the same reference numbers will be used throughout the drawings to refer to the same or like parts. In the following description, detailed descriptions of technologies or configurations related to the present invention may be omitted so as to avoid unnecessarily obscuring the subject matter of the present invention. When terms such as “including”, “having”, and “comprising” are used throughout the specification, an additional component may be present, unless “only” is used. A component described in a singular form encompasses a plurality thereof unless particularly stated otherwise.

The components included in the embodiments of the present invention should be interpreted to include an error range, even if there is no additional particular description thereof.

In describing the variety of embodiments of the present invention, when terms describing positional relationships such as “on”, “above”, “under” and “next to” are used, at least one intervening element may be present between the two elements, unless “immediately” or “directly” is used.

In describing the variety of embodiments of the present invention, when terms related to temporal relationships, such as “after”, “subsequently”, “next” and “before”, are used, the non-continuous case may be included, unless “immediately” or “directly” is used.

In describing the variety of embodiments of the present invention, terms such as “first” and “second” may be used to describe a variety of components, but these terms only aim to distinguish the same or similar components from one another. Accordingly, throughout the specification, a “first” component may be the same as a “second” component within the technical concept of the present invention, unless specifically mentioned otherwise.

Features of various embodiments of the present disclosure may be partially or completely coupled to or combined with each other, and may be variously inter-operated with each other and driven technically. The embodiments of the present disclosure may be carried out independently from each other, or may be carried out together in an interrelated manner.

As used herein, the term “doped” means that, in a material that accounts for most of the weight of a layer, a material (for example, N-type and P-type materials, or organic and inorganic substances) having physical properties different from the material that occupies most of the weight ratio of the layer is added in an amount less than 30% by weight. In other words, the “doped” layer refers to a layer that is used to distinguish a host material from a dopant material of a certain layer, in consideration of the specific gravity of the weight ratio. Also, the term “undoped” refers to any case other than the “doped” case. For example, when a layer contains a single material or a mixture of materials having the same properties as each other, the layer is included in the “undoped” layer. For example, if at least one of the materials constituting a certain layer is p-type and not all materials constituting the layer are n-type, the layer is included in the “undoped” layer. For example, if at least one of materials constituting a layer is an organic material and not all materials constituting the layer are inorganic materials, the layer is included in the "undoped" layer. For example, when all materials constituting a certain layer are organic materials, at least one of the materials constituting the layer is n-type and the other is p-type, when the n-type material is present in an amount of less than 30 wt %, or when the p-type material is present in an amount of less than 30 wt %, the layer is included in the "doped" layer.

Hereinafter, a light emitting element according to the present disclosure and a light emitting display device including the same will be described with reference to the accompanying drawings.

Figure 2:
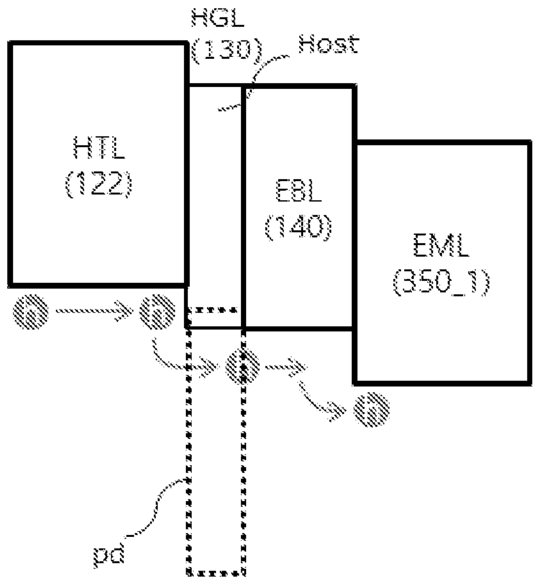
FIG. 2 is a view showing an energy band diagram of a hole transport unit adjacent to an emission layer of a first stack of FIG. 1.

FIG. 1 is a sectional view schematically showing a light emitting element according to an embodiment of the present disclosure, and FIG. 2 is a view showing an energy band diagram of a hole transport unit adjacent to an emission layer of a first stack of FIG. 1.

As shown in FIG. 1, the light emitting element according to the embodiment of the present disclosure includes a first electrode 110 and a second electrode 200 opposite each other, at least one charge generation layer CGL (e.g., $CGL_1$, . . . , $CGL_{n-1}$) 170 disposed between the first electrode 110 and the second electrode 200, and n stacks divided by the at least one charge generation layers CGL between the first and second electrodes 100 and 200. Here, n is a number equal to or greater than 2. The number of stacks is greater by one than the number of charge generation layers.

In addition, the first stack S1 close to the first electrode 110 includes a first emission layer 350_1 (EML1) provided between the first electrode 110 and a first one (CGL1) of the at least one charge generation layer CGL, a hole transport unit 1200 including a hole transport layer (HTL) 122, a hole generation layer (HGL) 130, and an electron blocking layer (EBL) 140 sequentially provided between the first electrode 110 and the first emission layer 350_1, and an electron transport layer (ETL) 160 provided between the first emission layer 350_1 and the first charge generation layer 170.

As shown in FIG. 2, the hole transport unit 1200 according to the present disclosure includes a hole transport layer 122 configured to transport holes injected from a hole injection layer (HIL) 121 to a first emission layer 350_1, an electron blocking layer 140 configured to prevent excitons generated from the first emission layer 350_1 or electrons transmitted to the first emission layer 350_1 from being transmitted to the hole transport layer 122, and a hole generation layer 130 located between the hole transport layer 122 and the electron blocking layer 140, the hole generation layer 130 being configured to withdraw or pull some electrons or excitons discharged through the electron blocking layer 140, thereby providing a hole generation effect. The hole generation layer 130 includes a material constituting the electron blocking layer 140 or an organic material having an energy bandgap similar to the energy bandgap of the material constituting the electron blocking layer 140 as a host, and also includes a p-type dopant pd.

As shown in FIG. 2, the host constituting the hole generation layer 130 may have a LUMO (Lowest Unoccupied Molecular Orbital) level and a HOMO (Highest Occupied Molecular Orbital) level different respectively from the LUMO level and the HOMO level of the electron blocking layer 140 by 1 eV or less. In order to prevent electrons or excitons from being transmitted to the hole transport layer 122 when the electrons or excitons are primarily discharged from the first emission layer 350_1, the host has a LUMO level that is not lower than the LUMO level of the first emission layer 350_1. Also, in order to transmit holes transmitted from the hole transport layer 122 to the first emission layer 350_1 without internal accumulation, the host has a HOMO level equal to or lower than the HOMO level of the hole transport layer 122 and a HOMO level higher than the HOMO level of the first emission layer 350_1.

In addition, the p-type dopant pd included in the hole generation layer 130 has a very low HOMO level of −9.0 eV or less in order to withdraw or pull some electrons or excitons discharged from the electron blocking layer 140, to generate holes in empty places, and to interact with a hole transport material, which is a host, in the hole generation layer 130 therearound, whereby a hole generation and transport function is enhanced.

The p-type dopant pd includes a substituent, such as a cyanide (CN) group or a fluorine (F) group, at an end group, thereby enhancing an electron withdrawing function. The p-type dopant pd not only captures electrons but also withdraws or pulls electrons and generates holes in empty places of electrons in order to increase generation of holes in the hole transport unit 1200 and to improve hole transport ability. As a result, it is possible to prevent carrier accumulation of holes that may occur in the hole transport layer 122 and the electron blocking layer 140 during driving, to increase the moving speed of holes finally transmitted to the first emission layer 350_1, and to increase the quantity of holes.

Through the above function, therefore, the hole generation layer 130 may reduce resistance to transmission of holes in an initial state or a low current density state, thereby reducing turn-on voltage when the light emitting element is driven, and may prevent efficiency change in low current density generated from the difference in inter-material mobility between the electron transport layer 160 and the hole transport layer 122.

The difference between the LUMO level of the p-type dopant pd and the HOMO level of the electron blocking layer 140 is 1 eV or less, and the p-type dopant pd may withdraw or pull electrons located at the HOMO level of the electron blocking layer 140 to generate holes.

The p-type dopant pd includes a substituent that withdraws electrons at an end group, and may be an organic material represented by Chemical Formula 1 as an example.

[Chemical Formula 1]

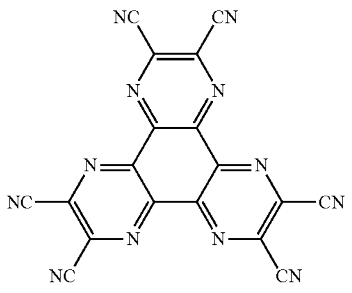

Alternatively, the p-type dopant pd may include radialene constituting a triangular ring as a core, and may have two different kinds of substituents that withdraw or pull electrons at an end group. For example, the p-type dopant pd may be an organic material represented by Chemical Formula 2. Molecular stability of radialene is low due to ring strain of the triangular ring, whereby hole radical generation is predominant, p-type transport characteristics are enhanced through interaction with a transport material therearound, and hole generation is possible even in the state in which bias is not applied since resistance is low.

[Chemical Formula 2]

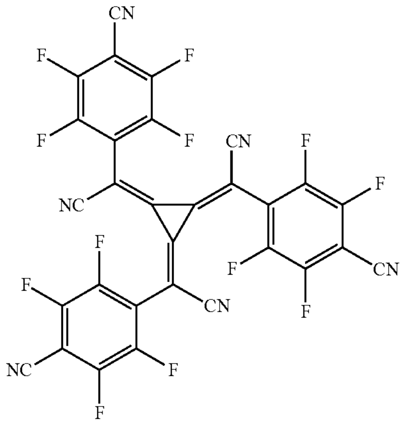

Meanwhile, in the hole generation layer 130 of the light emitting element according to the present disclosure, the p-type dopant pd has a LUMO level similar to or lower than the HOMO level of the host having a low HOMO level, thereby having an effect of withdrawing electrons and generating holes. In particular, when the core of radialene has a substituent having high electronegativity at an end group, as represented by Chemical Formula 2, the p-type dopant pd has an energy bandgap lower than a general p-type dopant, and therefore the host of the hole generation layer 130 that has a lower HOMO level than the hole transport layer 122 is easily doped with the p-type dopant pd.

The p-type dopant pd is included in the hole generation layer 130 so as to account for 1 vol % to 10 vol % based on the total volume of the hole generation layer 130. The reason that the content of the p-type dopant pd in the hole generation layer 130 must be 1 vol % or more of the total volume of the hole generation layer 130 is that it is necessary for the hole generation layer 130 to have a meaningful amount of the p-type dopant pd to be effective in generating holes. The reason that the content of the p-type dopant pd in the hole generation layer 130 must be 10 vol % or less of the total volume of the hole generation layer 130 is that it is necessary to balance between holes generated from the hole generation layer 130 and introduced into the first emission layer 350_1 and electrons introduced from the electron transport layer 160. For example, if the content of the p-type dopant pd in the hole generation layer 130 exceeds 10 vol % of the total volume of the hole generation layer 130, the quantity of holes that are generated from the hole generation layer 130 and injected into the first emission layer 350_1 may be greater than the quantity of electrons introduced from the electron transport layer 160 into the first emission layer 350_1.

The hole generation layer 130 may abut the electron blocking layer 140, and the thickness ratio of the hole generation layer 130 to the electron blocking layer 140 may be 1:4 to 1:1. That is, the thickness of the hole generation layer 130 is not greater than the thickness of the electron blocking layer 140. The reason for this is that it is necessary for the hole generation layer 130 to generate holes while impeding the function of the electron blocking layer 140. In addition, the thickness of the hole generation layer 130 is ¼ or more of the thickness of the electron blocking layer 140. The reason for this is that it is necessary for the hole generation layer 130 to have a meaningful thickness in order to withdraw electrons in a state of overlapping the first emission layer 350_1 while having processability, thereby generating holes. For example, when the total thickness of the hole generation layer 130 and the electron blocking layer 140 is 150 Å, the hole generation layer 130 may have a thickness ranging from 30 Å to 75 Å, and the electron blocking layer 140 may have a thickness ranging from 120 Å to 75 Å. If the total thickness of the hole generation layer 130 and the electron blocking layer 140 is increased or decreased, the thickness of the hole generation layer 130 and the thickness of the electron blocking layer 140 may be increased or decreased accordingly such that the thickness ratio of the hole generation layer 130 to the electron blocking layer 140 corresponds to 1:4 to 1:1. In order to secure a sufficient emission area in the first emission layer 350_1, it is preferable for the total thickness of the hole generation layer 130 and the electron blocking layer 140 to exceed 100 Å.

Meanwhile, the host of the hole generation layer 130 may be identical to an organic material constituting the electron blocking layer 140.

Meanwhile, in the light emitting element according to the present disclosure, the first stack S1 may further include a hole injection layer 121 including a metal fluoride and provided between the first electrode 110 and the hole transport layer 122.

The hole injection layer 121 abuts the first electrode 110, which is a transparent electrode made of a metal fluoride, such as $MgF_2$, or includes a metal ingredient, and the hole transport layer 122, which includes an organic ingredient, at both interfaces, has stability at the interfaces when holes are injected, and has low interfacial resistance equivalent to the work function of the first electrode 110.

In addition, the first charge generation layer 170, which connects the first stack S1 to the next stack, includes an n-type charge generation layer (N-CGL) 170*a* participating in generation and transport of electrons and a p-type charge generation layer (P-CGL) 170*b* participating in generation and transport of holes. That is, the electron transport layer 160 of the first stack S1 abuts the n-type charge generation layer 170*a*.

In the light emitting element according to the present disclosure, the hole generation layer is provided between the hole transport layer and the electron blocking layer in the hole transport unit of at least the first stack S1 provided between the first electrode 110 and the first charge generation layer 170, and materially or structurally compensates for the difference in speed between electrons and holes transmitted to the emission layer, whereby it is possible to increase the transmission speed and the transmission quantity of holes to the emission layer without accumulation of carriers, such as holes, in the hole transport unit at low current density, and therefore it is possible to prevent change in color efficiency when current density is changed while maintaining balance in recombination between holes and electrons of the emission layer.

Meanwhile, in order to describe significance of the hole generation layer according to the present disclosure, hole transport in a hole transport unit without a hole generation layer, unlike the hole transport unit of the light emitting element according to the present disclosure, will be described.

Figure 3A:
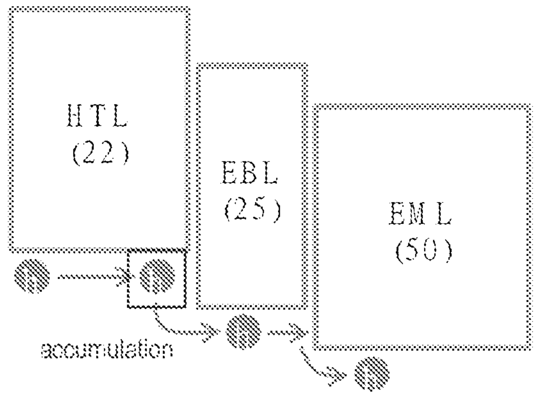
FIGS. 3A and 3B are views showing energy band diagrams of hole transport units in a first experimental example and a first experimental modification.
Figure 3B:
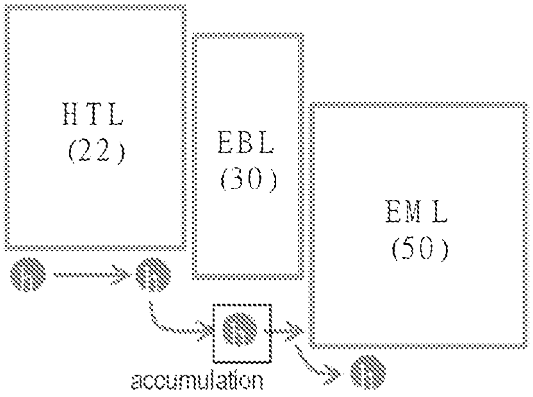

In experiments of FIGS. 3A and 3B, there is a difference in that, although the structure of FIG. 1 is used, no hole generation layer is provided in the first stack.

FIGS. 3A and 3B are views showing energy band diagrams of hole transport units in a first experimental example (Ex1) and a first experimental modification (Ex1a), respectively. FIGS. 3A and 3B show carrier accumulation due to the HOMO level of an electron blocking layer between a hole transport layer and an emission layer.

As shown in FIGS. 3A and 3B, in the first experimental example (Ex1) or the first experimental modification (Ex1a), respectively, a hole transport unit provided at one side of an emission layer 50 includes a hole transport layer 22 and an electron blocking layer 25 or 30.

In the structure of the first experimental example (Ex1) shown in FIG. 3A, a material having a low HOMO level is used as the electron blocking layer 25. In the structure of the first experimental modification (Ex1a) shown in FIG. 3B, a material having a low HOMO level is used as the electron blocking layer 30.

For example, in the first stack S1, a metal fluoride is used as the hole injection layer 121 abutting the first electrode 110, and the electron transport layer 160 and the n-type charge generation layer 170*a*, which is doped with a metal, such as lithium, are provided.

In this case, each of both interfaces of the first stack S1 is made of an inorganic material including a metal or has a structure abutting an inorganic material including a metal. As a result, the flow of holes is structurally slow, and the flow of electrons is structurally fast. That is, there is electron dominance.

In the first stack S1, therefore, electrons are introduced from the electron transport layer 160 into the emission layer 50 at high speed, whereas holes injected from the first electrode 110 are injected at low speed, and when an electron blocking layer 25 having a low HOMO level is applied, hole accumulation occurs at the interface between the hole transport layer 21 and the electron blocking layer 25 having a larger HOMO level difference between adjacent layers, as in the first experimental example (Ex1) of FIG. 3A. Also, in the structure in which an electron blocking layer 30 having a low HOMO level is provided, as in the first experimental modification (Ex1a) of FIG. 3B, the electron blocking layer 30 and the emission layer 50 have a large HOMO level difference therebetween, whereby hole accumulation occurs between the electron blocking layer 30 and the emission layer 50.

Hole accumulation is caused by physical properties of the layers constituting the stack. During high-gradation driving, both holes and electrons have high mobility due to high current density. During low-gradation driving, however, holes are easily affected by physical properties of each layer. Meanwhile, the comparative experiments of FIGS. 3A and 3B show that it is difficult to avoid hole accumulation during low current density driving by changing only the material for the electron blocking layer between the hole transport layer and the emission layer.

The light emitting element and the display device according to the present disclosure propose a structure in which, in the stack having electron dominance due to provision of an inorganic material at the interface of the stack during low-gradation driving, the hole generation layer is further provided between the hole transport layer and the electron blocking layer, whereby hole accumulation is avoided during low-gradation driving, and therefore the emission layer has uniform efficiency irrespective of current density.

Hereinafter, second to fourth experimental examples each having a hole generation layer, as in the light emitting element according to the present disclosure, will be described for comparison with the first experimental example.

Figure 4A:
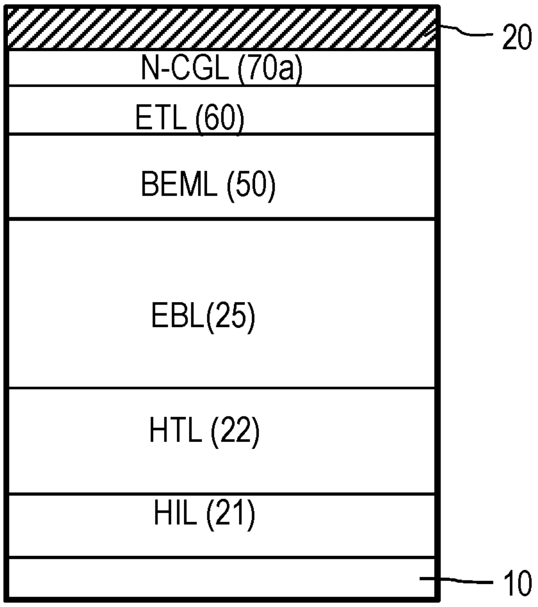
FIGS. 4A and 4B are sectional views schematically showing light emitting elements according to a first experimental example and a second experimental example.
Figure 4B:
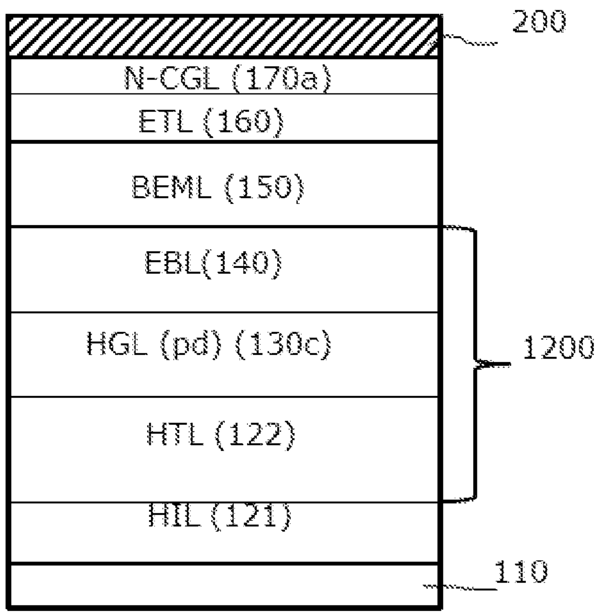
Figure 5:
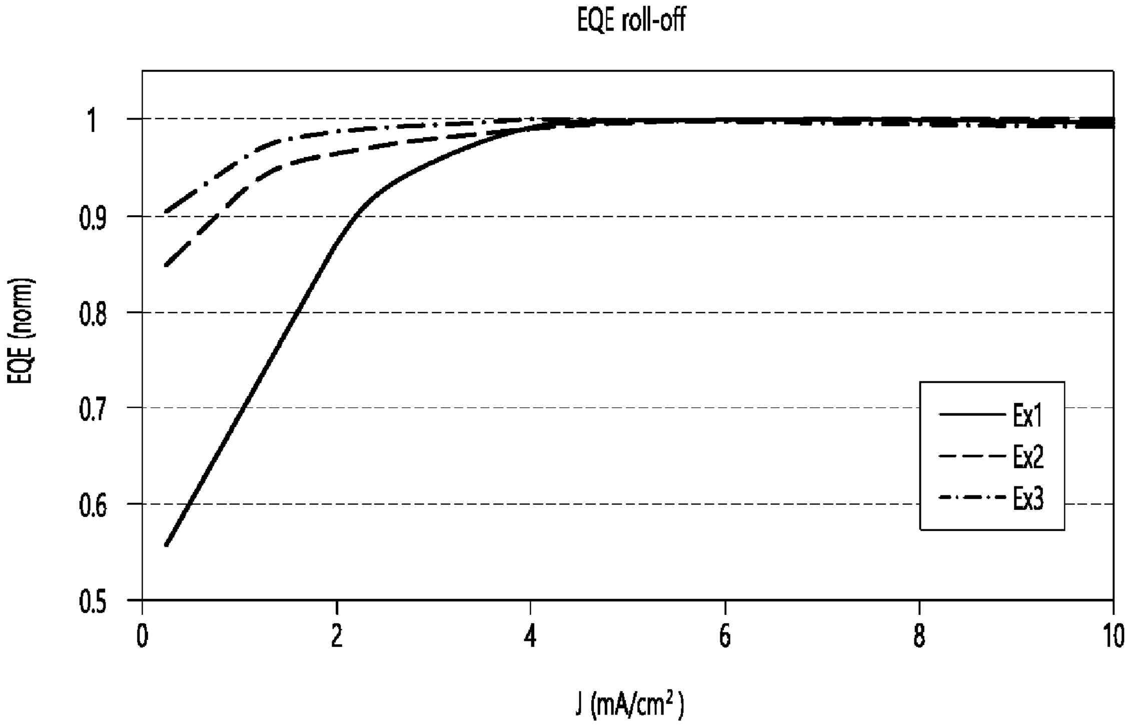
FIG. 5 is a graph showing a change in external quantum efficiency based on current density in first to third experimental examples.
Figure 6:
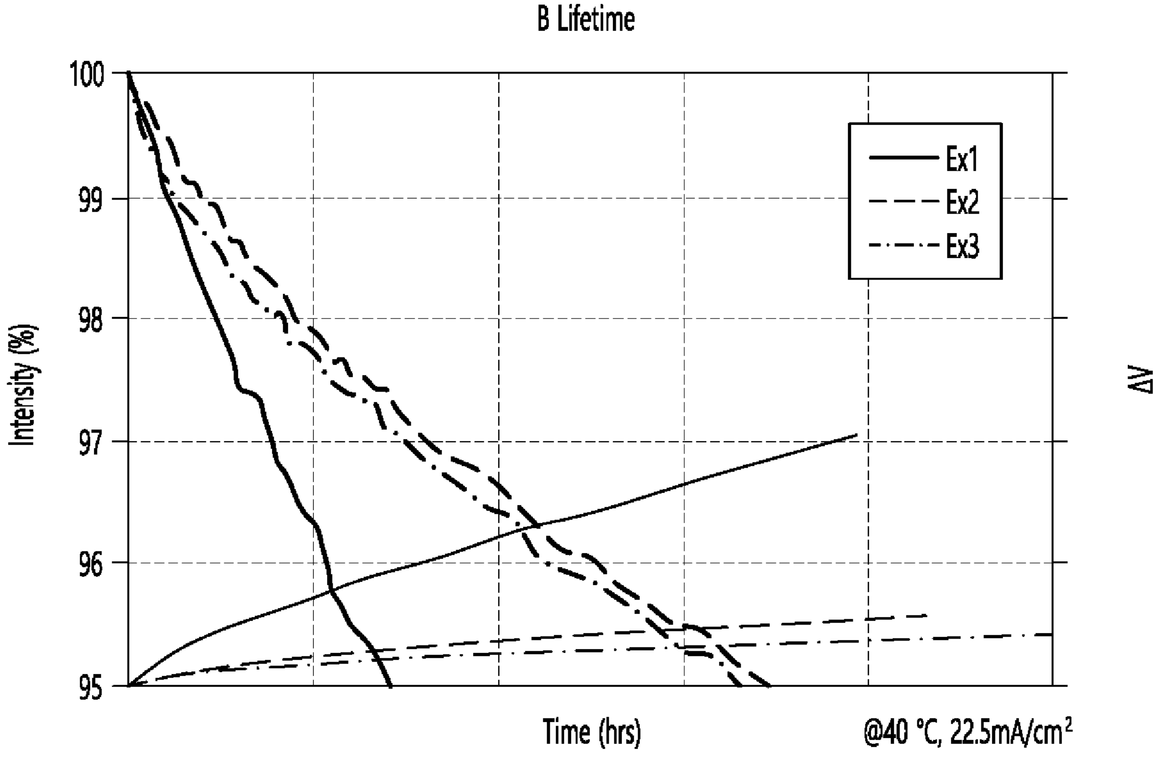
FIG. 6 is a graph showing a change in driving voltage and lifetime in the first to third experimental examples.

FIGS. 4A and 4B are sectional views schematically showing light emitting elements according to a first experimental example and a second experimental example, and FIG. 5 is a graph showing a change in external quantum efficiency based on current density in first to third experimental examples. FIG. 6 is a graph showing a change in driving voltage and lifetime in the first to third experimental examples.

In the light emitting element according to the first experimental example, as shown in FIG. 4A, a hole injection layer 21 having a thickness of 70 Å, a hole transport layer 22 having a thickness of 950 Å, an electron blocking layer 25 having a thickness of 150 Å, a blue emission layer (BEML) 50 having a thickness of 200 Å, an electron transport layer 60 having a thickness of 150 Å, a charge generation layer 70*a* having a thickness of 170 Å, and a second electrode 20 made of aluminum are sequentially formed on a first electrode 10 made of ITO.

The hole injection layer 21 may be made of a metal fluoride, such as $MgF_2$, and the hole transport layer 22 may be made of NPB (N,N'-bis-(1-naphthyl)-N,N'-diphenyl-1,1'-biphenyl-4,4'diamine), CBP (4,4'-bis(carbazol-9-yl), TPD (N,N'-bis(3-methylphenyl)-N,N'-bis(phenyl)-benzidine), Spiro-TAD (2,2',7,7'-tetrakis(N,N-diphenylamino-9,9'-spirobifluorene), or MTDATA (4,4',4"-tris(N-3-methylphenyl-N-phenyl-amino)-triphenylamine. The electron blocking layer 25 may be made of a material that has a lower HOMO level than the hole transport layer 22 and a higher LUMO level than the blue emission layer 50. The electron blocking layer 25 may be made of a material, such as TAPC or TCTA. However, the present disclosure is not limited thereto. The electron blocking layer 25 may be made of a material that is similar to the material for the hole transport layer 22 but has a lower HOMO level than the hole transport layer 22 and a higher LUMO level than a host of the blue emission layer 50 by changing a substituent. As an example, the electron transport layer 60 may be made of a compound having anthracene as a core.

The material for the blue emission layer 50 may include at least one blue host and at least one blue dopant. Specifically, the blue emission layer 50 may be formed by doping at least one host material selected from the group consisting of an anthracene derivative, a pyrene derivative, and a perylene derivative with a pyrene-based or boron-based blue dopant.

Meanwhile, the materials for the layers specified in the first experimental example (Ex1) are provided as an example. It is meaningful that the same material is used for the same layer in the first to fourth experimental examples, and other materials may be used as long as the same function or a similar function can be provided.

In the light emitting element according to the second experimental example (Ex2), as shown in FIG. 4B, a hole injection layer 121 having a thickness of 70 Å, a hole transport layer 122 having a thickness of 950 Å, a hole generation layer 130 having a thickness of 30 Å, an electron blocking layer 140 having a thickness of 120 Å, a blue emission layer 150 having a thickness of 200 Å, an electron transport layer 160 having a thickness of 150 Å, an n-type charge generation layer 170*a* having a thickness of 170 Å, and a second electrode 200 made of aluminum are sequentially formed on a first electrode 110 made of ITO.

In the second experimental example (Ex2), the hole generation layer 130 has the same material as the electron blocking layer 140 as a host and has the material represented by Chemical Formula 2 above as a p-type dopant. The p-type dopant is included so as to account for 5 vol % of the hole generation layer 130. The sum of the thicknesses of the hole generation layer 130 and the electron blocking layer 140 of the second experimental example, which is 150 Å, is equal to the thickness of the electron blocking layer 140 of the first experimental example.

In the third experimental example (Ex3), the structure of FIG. 4B is provided, and the materials and doping amounts of the layers are the same as in the second experimental example (Ex2), but there is a difference in that the thicknesses of the hole generation layer 130 and the electron blocking layer 25 are 50 Å and 100 Å, respectively.

TABLE 1

| Class | Hole transport unit | Vc [V] | ΔEQE | ΔLifetime (T95) |
|---|---|---|---|---|
| Ex1 | HTL/EBL (150 Å) | 0.0 | 0.44 | 100% |
| Ex2 | HTL/HGL (30 Å)/EBL (120 Å) | −0.1 | 0.15 | 245% |
| Ex3 | HTL/HGL (50 Å)/EBL (100 Å) | −0.3 | 0.11 | 228% |

ΔEQE, which is change in external quantum efficiency based on change in current density in each experiment, is a ratio of external quantum efficiency during driving at a current density of 0.1 $mA/cm^2$ to external quantum efficiency during driving at a current density of 10 $mA/cm^2$.

Vc, which is driving voltage in each of the first to third experimental examples compared to driving voltage in the first experimental example, is a fluctuating value of driving voltage changed over time from an initial state at a current density of 10 $mA/cm^2$. When the hole generation layer is provided, the value of Vc means decrease in voltage due to increase in the current density, compared to the first experimental example Ex1.

In addition, ΔLifetime (T95) is lifetime until efficiency is degraded to 95% of initial efficiency, compared to the first experimental example.

It can be seen from Table 1 and FIG. 5 that, in the first experimental example (Ex1), on the assumption that the external quantum efficiency during driving at a current density of 10 $mA/cm^2$ is 1, the external quantum efficiency during driving at a current density of 0.1 $mA/cm^2$ is reduced to 0.56, whereby there is an abrupt change in external quantum efficiency between high gradation and low gradation. In the first to third experimental examples, experiments were performed using the blue emission layer as the emission layer of the first stack. That is, in the blue stack, there is an abrupt difference in color efficiency during low-gradation driving. In a structure having a plurality of stacks, white light is implemented in the state in which the efficiency of blue light is relatively low at low gradation, compared to other colors, blue efficiency is lower than other color efficiency, as in the structure of the first experimental example.

In contrast, in the second experimental example (Ex2), in which the hole generation layer is provided between the hole transport layer and the electron blocking layer, on the assumption that the external quantum efficiency during driving at a current density of 10 $mA/cm^2$ is 1 in the first experimental example (Ex1), the external quantum efficiency during driving at a current density of 0.1 $mA/cm^2$ is 0.85, whereby it can be seen that a change in external quantum efficiency between high gradation and low gradation is remarkably reduced, compared to the first experimental example. In addition, the change in external quantum efficiency between high gradation and low gradation is 15% or less, whereby it can be seen that visibility in color efficiency change is greatly reduced during low-gradation driving.

Meanwhile, in the third experimental example (Ex3), in which the hole generation layer is provided between the hole transport layer and the electron blocking layer and the thickness of the hole generation layer is increased, on the assumption that the external quantum efficiency during driving at a current density of 10 $mA/cm^2$ is 1 in the first experimental example (Ex1), the external quantum efficiency during driving at a current density of 0.1 $mA/cm^2$ is 0.89, whereby it can be seen that a change in external quantum efficiency between high gradation and low gradation is also further reduced, compared to the second experimental example. In addition, the change in external quantum efficiency between high gradation and low gradation is 11% or less, whereby it is possible to almost eliminate visibility in color efficiency change during low-gradation driving.

In addition, as shown in Table 1, it can be seen that the driving voltages of the second and third experimental examples (Ex2 and Ex3) are lower than the driving voltage of the first experimental example by 0.1 V and 0.3 V, respectively, whereby the driving voltages are reduced in both the second and third experimental examples (Ex2 and Ex3), in which the hole generation layer is provided.

In experiments of FIG. 6, lifetime and a change in driving voltage based on an initial state were measured at a temperature of 40° C. and a current density of 22.5 $mA/cm^2$.

As shown in FIG. 6, it can be seen that change in driving voltage over time is large in the first experimental example, whereas change in driving voltage over time is remarkably reduced in the second and third experimental examples. In the first experimental example, change in driving voltage over time is large, whereby it may be difficult to drive the light emitting element at driving voltage set in an initial state after lapse of a predetermined time. In contrast, in the second and third experimental examples, change in driving voltage over time is small, whereby it is possible to stably drive the light emitting element for a long time under conditions similar to the initial state.

In addition, as shown in FIG. 6, in the second and third experimental examples, in which the hole generation layer is provided, 95 lifetime (T95) is twice or more 95 lifetime of the first experimental example, in which no hole generation layer is provided. The reason for this is that, as previously described, hole accumulation occurs at the interface of the hole transport layer in the first experimental example, whereas some electrons or excitons discharged from the emission layer are withdrawn to generate holes by the provision of the hole generation layer in the second and third experimental examples, whereby the quantity of holes that are generated is increased, and therefore it is possible to stably maintain balance between holes and electrons at the emission layer.

Hereinafter, JV (current density vs. voltage) characteristics based on the material for the hole generation layer will be described with further reference to a fourth experimental example.

Figure 7:
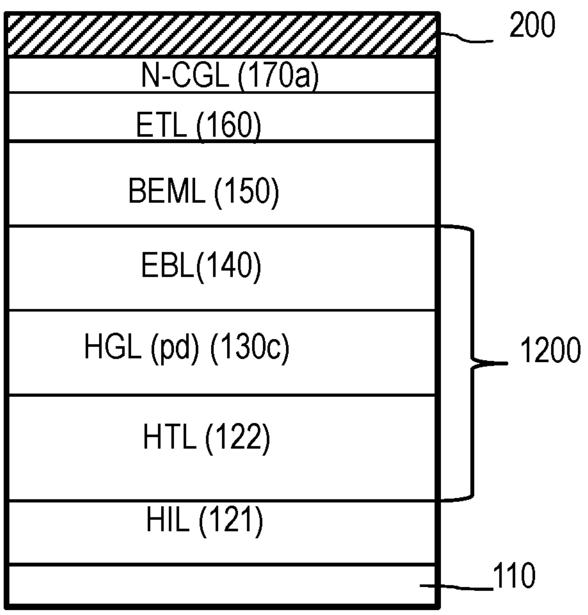
FIG. 7 is a sectional view schematically showing a light emitting element according to a fourth experimental example.
Figure 8:
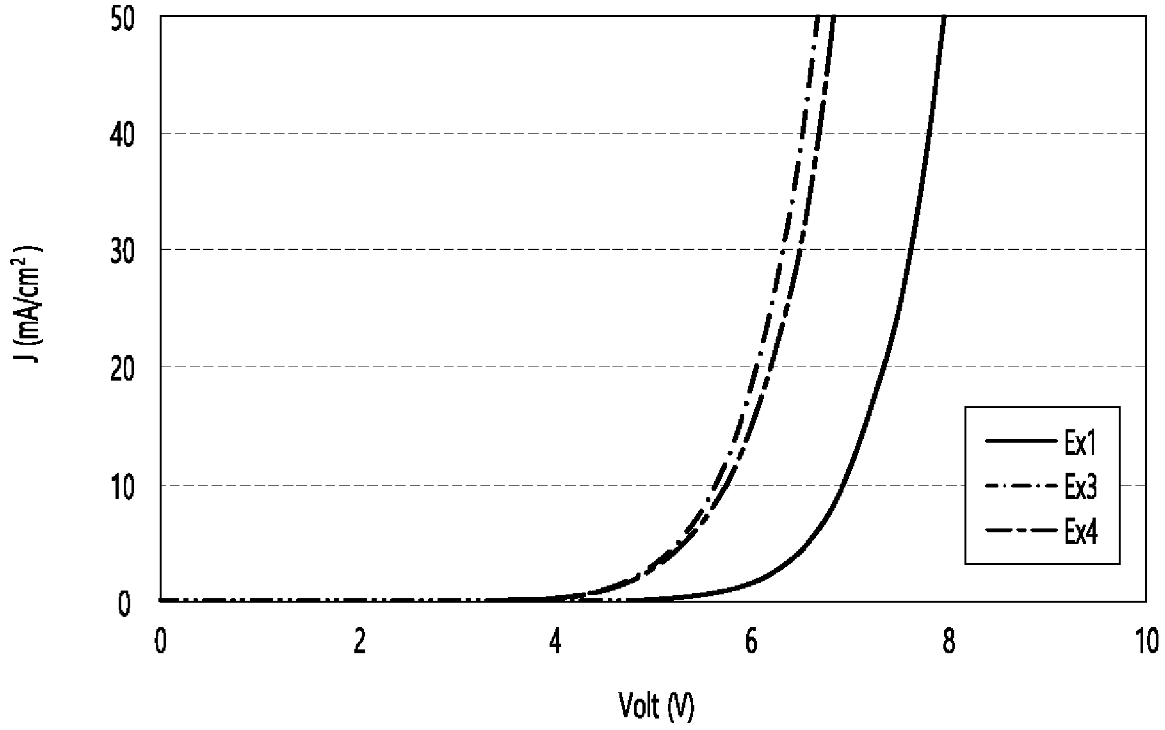
FIG. 8 is a graph showing JV characteristics in the first experimental example, the third experimental example, and the fourth experimental example.
Figure 9:
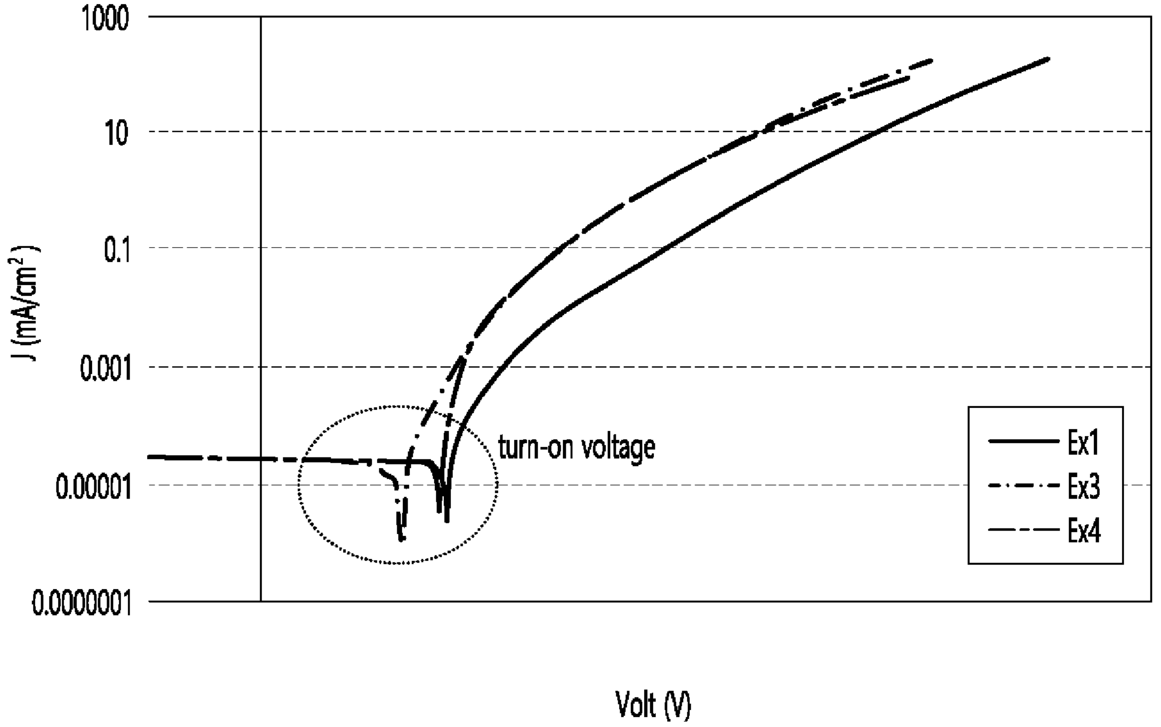
FIG. 9 is a graph showing turn-on voltage characteristics in the first experimental example, the third experimental example, and the fourth experimental example.

FIG. 7 is a sectional view schematically showing a light emitting element according to a fourth experimental example (Ex4), and FIG. 8 is a graph showing JV characteristics in the first experimental example, the third experimental example, and the fourth experimental example. FIG. 9 is a graph showing turn-on voltage characteristics in the first experimental example, the third experimental example, and the fourth experimental example.

As shown in FIG. 7, in the light emitting element according to the fourth experimental example, a hole generation layer 130*c* is formed using only a single p-type dopant. In this case, in the fourth experimental example, the hole generation layer is formed using only the p-type dopant so as to have a thickness of 50 Å and the other layers have the same constructions as in the third experimental example in order to compare JV characteristics based on the difference in material ingredients from the third experimental example. Meanwhile, the material represented by Chemical Formula 1 above was used as the p-type dopant of the fourth experimental example.

When voltage values are increased in both the third experimental example and the fourth experimental example, as shown in FIG. 8, it can be seen that, when a driving voltage of 4 V or more is applied, current density is increased, and when the driving voltage is 6 V or more, a current density of 15 $mA/cm^2$ is obtained. In contrast, in the first experimental example, in which no hole generation layer is provided, the current density is less than 5 $mA/cm^2$ even when a driving voltage of 6 V or more is applied. Consequently, it can be seen that, when the hole generation layer is provided, it is possible to reduce driving voltage to achieve a given current density.

Meanwhile, as shown in FIG. 9, it can be seen that driving voltage required to obtain a current density of 0.001 $mA/cm^2$ is lowered in both the third and fourth experimental examples. In the fourth experimental example, in which the hole generation layer includes only a single p-type dopant, turn-on driving voltage is increased, similarly to the first experimental example. This means that, when the hole generation layer is constituted by only the p-type dopant, there is a limitation in reducing initial turn-on voltage, and it can be seen that an organic host capable of performing an electron blocking function is required for the hole generation layer.

Meanwhile, in Chemical Formula 2 used as the p-type dopant in the third experimental example, the radialene core has a substituent having high electronegativity.

Consequently, the p-type dopant has a lower energy bandgap than a known p-type dopant, such as TCNQ or F4TCNQ, and therefore it is possible to dope an organic host having a lower HOMO level than the hole transport layer with the p-type dopant.

Hereinafter, embodiments of the light emitting element according to the present disclosure and a display device having the light emitting element applied thereto will be described.

Figure 10:
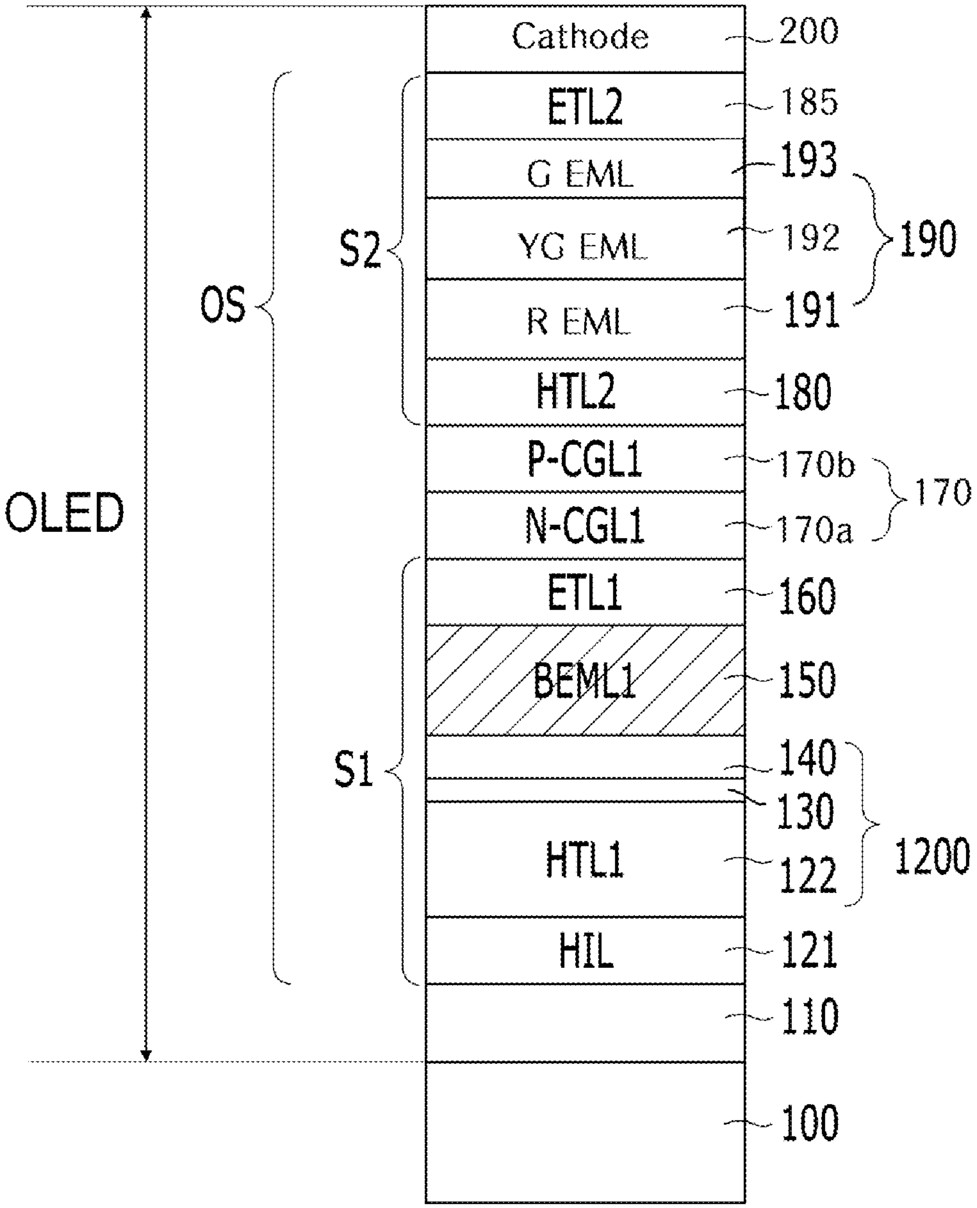
FIG. 10 is a sectional view schematically showing a light emitting element according to a first embodiment of the present disclosure.

FIG. 10 is a sectional view schematically showing a light emitting element according to a first embodiment of the present disclosure.

As shown in FIG. 10, the light emitting element OLED according to the first embodiment of the present disclosure is configured such that two stacks (a first and second stacks S1 and S2) are divided by one charge generation layer 170 between a first electrode 110 and a second electrode 200 opposite each other on a substrate 100.

As described with reference to FIG. 1 and as shown in FIG. 10, the first stack S1 includes a stack of a hole injection layer 121, a hole transport unit 1200 constituted by a hole transport layer (HTL1) 122, a hole generation layer 130, and an electron blocking layer 140, a blue emission layer (BEML1) 150, and an electron transport layer (ETL1) 160 sequentially provided on the first electrode 110. That is, the hole generation layer 130 of the first stack S1 may withdraw or pull some electrons or excitons discharged from the blue emission layer 150 to generate holes, whereby it is possible to increase the injection speed and the transport quantity of holes to the blue emission layer 150 and to maintain balance between holes and electrons at the blue emission layer 150 irrespective of current density.

The second stack S2 may include emission layers capable of emitting white light together with the blue emission layer 150 in order to emit white light from a combination of light emitted from the first and second stacks S1 and S2. As an example, as shown in FIG. 10, an emission portion 190 of the second stack S2 includes a plurality of emission layers having different wavelengths longer than the wavelength of blue light. The emission portion 190 is provided between a hole transport layer (HTL2) 180 and an electron transport layer (ETL2) 185, and includes a red emission layer (R EML) 191, a yellowish green emission layer (YG EML) 192, and a green emission layer (G EML) 193.

Depending on circumstances, the emission portion 190 may have a two-layered structure including a red emission layer 191 and a yellowish green emission layer 192.

When the blue emission layer 150 of the first stack S1 is a fluorescent emission layer, each of the emission layers 191, 192, and 193 provided in the emission portion 190 of the second stack S2 may be a phosphorescent emission layer. However, this is merely an example, and the emission layers of the first and second stacks S1 and S2 may be commonly fluorescent emission layers or phosphorescent emission layers. Depending on circumstances, when the blue emission layer 150 of the first stack S1 is a fluorescent emission layer, any one of the plurality of emission layers provided in the second stack S2 may be a fluorescent emission layer, and the other emission layers may be phosphorescent emission layers. Alternatively, each emission layer may include both a fluorescent dopant and a phosphorescent dopant, whereby the emission layer may have both fluorescent and phosphorescent properties.

Figure 11:
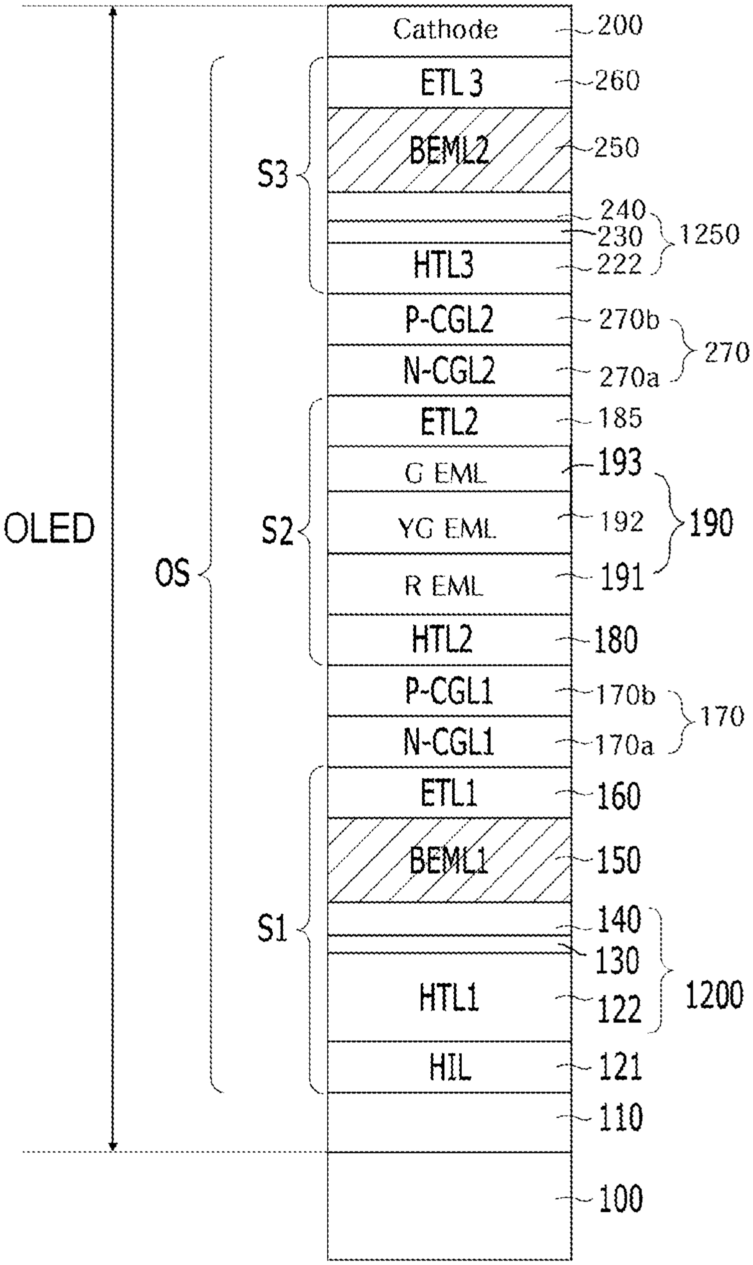
FIG. 11 is a sectional view schematically showing a light emitting element according to a second embodiment of the present disclosure.

FIG. 11 is a sectional view schematically showing a light emitting element according to a second embodiment of the present disclosure.

As shown in FIG. 11, the light emitting element according to the second embodiment of the present disclosure is configured such that a second charge generation layer 270 and a third stack S3 are further provided on the second stack in the light emitting element according to the first embodiment and the third stack S3 is a blue emission stack. In this case, the second charge generation layer 270 may be constituted by a stack of an n-type charge generation layer (N-CGL2) 270*a* and a p-type charge generation layer (P-CGL2) 270*b*, as in the first charge generation layer 170 provided between the first and second stacks S1 and S2.

The third stack S3 includes a hole transport unit 1250 constituted by a stack of a hole transport layer (HTL3) 222, a hole generation layer 230, and an electron blocking layer 240, a second blue emission layer (BEML2) 250, and an electron transport layer (ETL3) 260 sequentially provided on the p-type charge generation layer 270*b*, in the same manner as in FIG. 1. As previously described, even in the third stack S3, the hole generation layer 230 in the hole transport unit 1250 may withdraw or pull some electrons or excitons discharged from the second blue emission layer 250 to generate holes, whereby it is possible to increase the injection speed and the transport quantity of holes to the second blue emission layer 250 and to maintain balance between holes and electrons at the second blue emission layer 250 irrespective of current density.

Depending on circumstances, the hole generation layer may be provided only in the first stack S1, and the hole generation layer may be omitted from the third stack S3. In the first stack S1, the hole injection layer 121 made of the metal fluoride and the n-type charge generation layer 170*a* doped with the metal ions, such as lithium, are located at both interfaces thereof, whereby initial resistance may be high due to the physical properties of the layers in the first stack, and therefore the difference in moving speed between holes and electrons may easily occur during low-gradation driving. In order to compensate therefor, the hole generation layer is provided in the first stack S1.

Figure 12A:
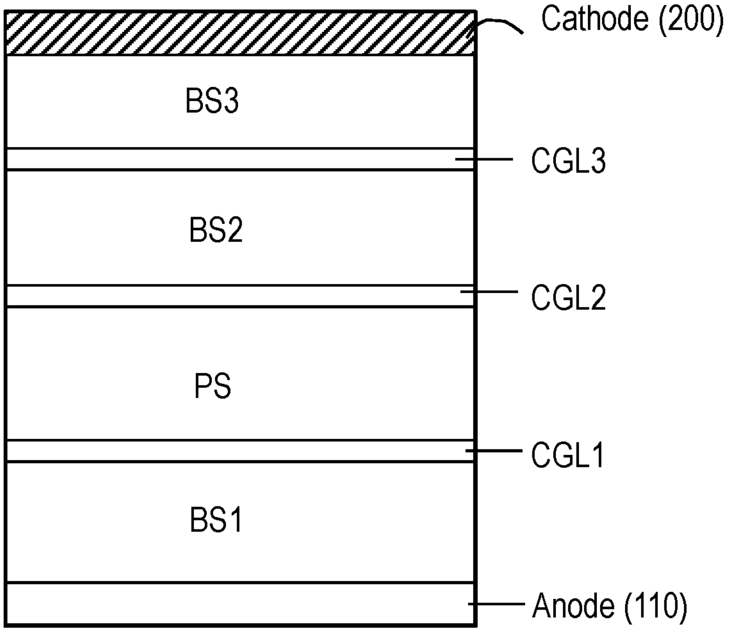
FIGS. 12A to 12C are sectional views schematically showing light emitting elements according to third to fifth embodiments of the present disclosure.
Figure 12B:
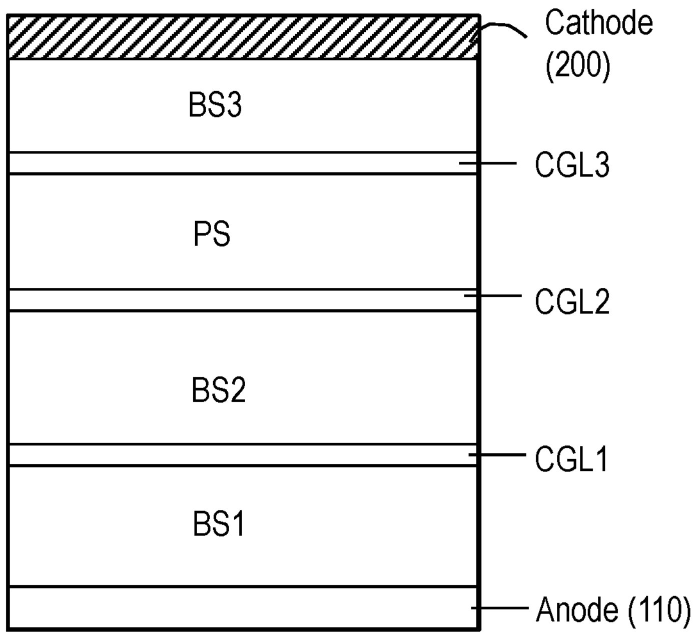
Figure 12C:
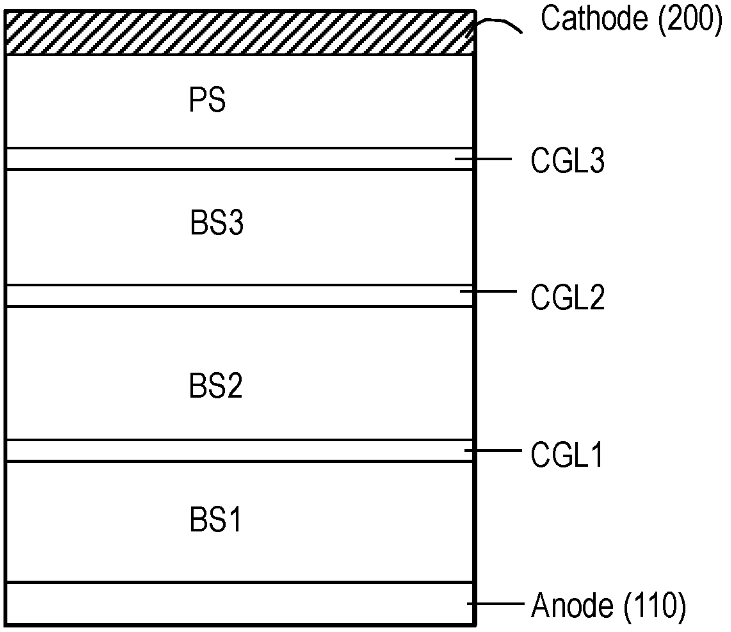

FIGS. 12A to 12C are sectional views schematically showing light emitting elements according to third to fifth embodiments of the present disclosure.

Referring to FIGS. 12A to 12C, the light emitting elements according to the third to fifth embodiments of the present disclosure are configured such that, in order to more improve blue efficiency, each light emitting element includes four stacks provided between a first electrode 110 and a second electrode 200, and a phosphorescent stack PS includes emission layers having colors other than a blue color while the other stacks are constituted by blue stacks BS1, BS2, and BS3.

In addition, the light emitting elements according to the third to fifth embodiments of the present disclosure may be distinguished from each other based on the position of the phosphorescent stack PS. In the light emitting element according to the third embodiment shown in FIG. 12A, the second stack from the first electrode 110 is the phosphorescent stack PS. In the light emitting element according to the fourth embodiment shown in FIG. 12B, the third stack from the first electrode 110 is the phosphorescent stack PS. In the light emitting element according to the fifth embodiment shown in FIG. 12C, the fourth stack from the first electrode 110 is the phosphorescent stack PS.

In each of the blue stacks BS1, BS2, and BS3, a hole transport unit 1200 constituted by a stack of a hole transport layer 122, a hole generation layer 130, and an electron blocking layer 140, as described with reference to FIG. 1, may be provided adjacent to a blue emission layer.

Even in the light emitting elements according to the third to fifth embodiments, it is possible to obtain the same effects due to the hole generation layer.

Figure 13:
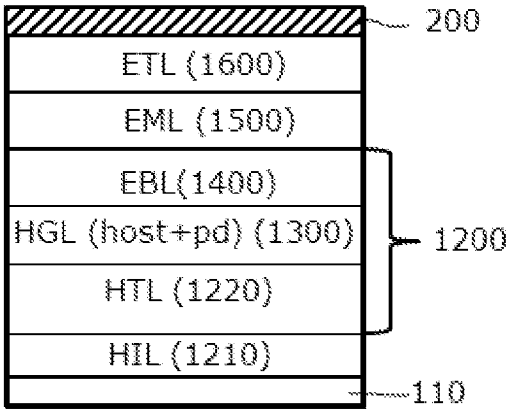
FIG. 13 is a sectional view schematically showing a light emitting element according to a sixth embodiment of the present disclosure.

FIG. 13 is a sectional view schematically showing a light emitting element according to a sixth embodiment of the present disclosure.

The light emitting element according to the sixth embodiment of the present disclosure shown in FIG. 13 is configured such that a single stack including a single emission layer 1500 is provided between a first electrode 110 and a second electrode 200.

Compared to the above embodiments, the emission layer 1500 may be an emission layer configured to emit a color of light different from blue light. Consequently, the emission layer 1500 may be a green emission layer, a red emission layer, or an emission layer that emits another color of light.

As shown in FIG. 13, the light emitting element according to the sixth embodiment includes an emission layer 1500 provided between a first electrode 110 and a second electrode 200, a hole transport unit 1200 including a hole transport layer 1220, a hole generation layer 1300, and an electron blocking layer 1400 sequentially provided between the first electrode 110 and the emission layer 1500, and an electron transport layer 1600 provided between the emission layer 1500 and the second electrode 200. An electron injection layer may be further provided between the electron transport layer 1600 and the second electrode 200.

The hole transport unit 1200 according to the present disclosure includes a hole transport layer 1220 configured to transmit holes injected from the hole injection layer 1210 to the emission layer 1500, an electron blocking layer 1400 configured to prevent excitons generated from the emission layer 1500 or electrons transmitted to the emission layer 1500 from being transmitted to the hole transport layer 1220, and a hole generation layer 1300 located between the hole transport layer 1220 and the electron blocking layer 1400, the hole generation layer 1300 being configured to withdraw or pull some electrons or excitons discharged through the electron blocking layer 1400, thereby providing a hole generation effect. The hole generation layer 1300 includes a material constituting the electron blocking layer 1400 or an organic material having an energy bandgap similar to the energy bandgap of the material constituting the electron blocking layer 1400 as a host, and also includes a p-type dopant pd.

The host constituting the hole generation layer 1300 may have a LUMO level and a HOMO level different from the LUMO level and the HOMO level of the electron blocking layer 1400 by 1 eV or less. In order to prevent electrons or excitons from being transmitted to the hole transport layer when the electrons or excitons are primarily discharged from the emission layer 1500, the host has a LUMO level that is not lower than the LUMO level of the emission layer 1500. Also, in order to transmit holes transmitted from the hole transport layer 1220 to the emission layer 1500 without internal accumulation, the host has a HOMO level equal to or lower than the HOMO level of the hole transport layer 1220 and a HOMO level higher than the HOMO level of the emission layer 1500.

In addition, the p-type dopant included in the hole generation layer 1300 has a very low HOMO level of −9.0 eV or less in order to withdraw or pull some electrons or excitons discharged from the electron blocking layer 1400, to generate holes in empty places, and to interact with a hole transport material, which is a host, in the hole generation layer therearound, whereby a hole generation and transport function is enhanced.

The p-type dopant pd includes a substituent, such as a cyanide (CN) group or a fluorine (F) group, at an end group, thereby enhancing an electron withdrawing function. The p-type dopant pd not only captures electrons but also withdraws or pulls electrons and generates holes in empty places of electrons in order to increase generation of holes in the hole transport unit 1200 and to improve hole transport ability. As a result, it is possible to prevent carrier accumulation of holes that may occur in the hole transport layer 1220 and the electron blocking layer 1400 during driving, to increase the moving speed of holes finally transmitted to the emission layer, and to increase the quantity of holes.

The light emitting element according to the sixth embodiment shown in FIG. 13 is similar in construction to the first stack of FIG. 1, which means that even a single emission stack that emits a color of light other than blue light has an effect obtained by the provision of a hole generation layer.

Figure 14:
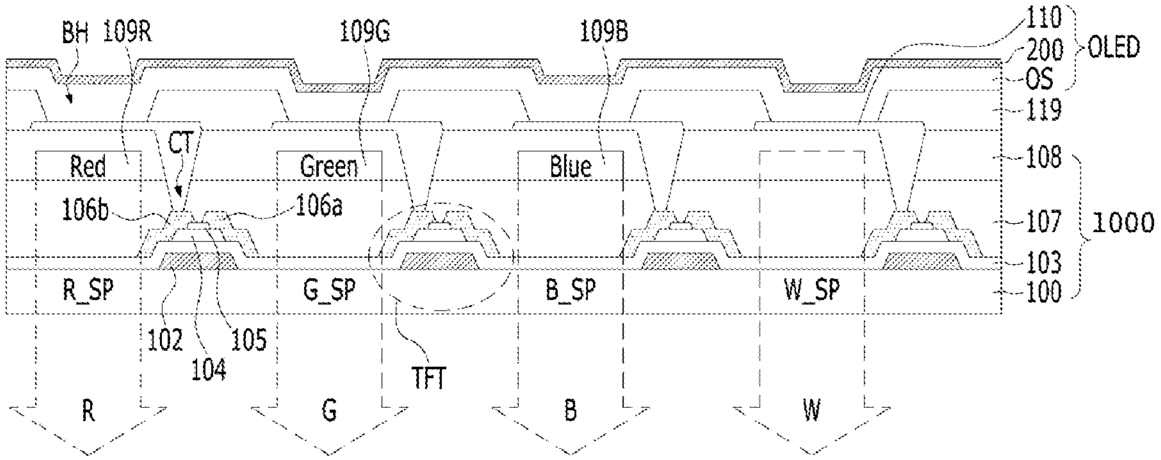
FIG. 14 is a sectional view schematically showing a display device according to the present disclosure.

FIG. 14 is a sectional view showing a display device according to the present disclosure.

Meanwhile, the light emitting element may be commonly applied to a plurality of subpixels in order to emit white light through an electrode at an exit side.

As shown in FIG. 14, the display device according to the present disclosure may include a substrate 100 having a plurality of subpixels R_SP, G_SP, B_SP, and W_SP, a white light emission element OLED commonly provided on the substrate 100, a thin film transistor TFT provided at each subpixel, the thin film transistor being connected to a first electrode 110 of the white light emission element OLED, and color filter layers 109R, 109G, and 109B provided under the first electrode 110 of at least one of the subpixels.

In the example shown, the white subpixel W_SP is included; however, the present disclosure is not limited thereto. The white subpixel W_SP may be omitted, and only the red, green, and blue subpixels R_SP, G_SP, and B_SP may be provided. Depending on circumstances, a combination of a cyan subpixel, a magenta subpixel, and a yellow subpixel capable of expressing a white color may be provided instead of the red, green, and blue subpixels.

As an example, the thin film transistor TFT includes a gate electrode 102, a semiconductor layer 104, and a source electrode 106*a* and a drain electrode 106*b* connected to opposite sides of the semiconductor layer 104. A channel passivation layer 105 configured to prevent direct connection between the source and drain electrodes 106*a* and 106*b* and the semiconductor layer 104 may be further provided on the portion of the semiconductor layer 104 at which a channel is located.

A gate insulating film 103 is provided between the gate electrode 102 and the semiconductor layer 104.

For example, the semiconductor layer 104 may be made of any one of an oxide semiconductor, amorphous silicon, and polysilicon or a combination of two or more thereof. For example, when the semiconductor layer 104 is made of an oxide semiconductor, it is possible to reduce heating temperature necessary to form the thin film transistor, and therefore the degree of freedom in using the substrate 100 is high, which is advantageous in application to a flexible display device.

In addition, the drain electrode 106*b* of the thin film transistor TFT may be connected to the first electrode 110 in a contact hole CT provided in first and second passivation films 107 and 108.

The first passivation film 107 is provided to primarily protect the thin film transistor TFT, and the color filter layers 109R, 109G, and 109B may be provided thereon.

When the plurality of subpixels includes a red subpixel R_SP, a green subpixel G_SP, a blue subpixel B_SP, and a white subpixel W_SP, the color filter layers may be provided at the subpixels excluding the white subpixel W_SP as first to third color filter layers 109R, 109G, and 109B in order to transmit white light passing through the first electrode 110 based on wavelengths thereof. In addition, the second passivation film 109 is formed under the first electrode 110 so as to cover the first to third color filter layers 109R, 109G, and 109B. The first electrode 110 is formed on the surface of the second passivation film 109 excluding the contact hole CT.

Here, the light emitting element OLED includes a first electrode 110, which is transparent, a second electrode 200 opposite the first electrode, the second electrode being reflective, and a hole transport unit 1200 constituted by a stack of a hole transport layer, a hole generation layer, and an electron blocking layer provided in any one of stacks divided by a charge generation layer between the first and second electrodes 110 and 200, as shown in FIGS. 10 to 12C.

The first electrode 110 is divided for each subpixel, the other layers of the white light emitting element OLED are integrally provided over a display area without subpixel-specific division.

Here, reference numeral 119 indicates banks, and BH between the banks indicates a bank hole. Light is emitted from an area open through the bank hole, and the bank hole defines an emission portion of each subpixel.

Meanwhile, as the construction under the first electrode 110, the substrate 100, the thin film transistor TFT, the color filter layers 109R, 109G, and 109B, and insulating films on which these components are disposed are referred to as a thin film transistor array substrate.

In a light emitting element according to the present disclosure and a display device including the same, an electron blocking layer configured to primarily block electrons or excitons discharged from an emission layer to a hole transport layer is provided between the emission layer and the hole transport layer, and a hole generation layer configured to receive some discharged electrons or excitons to generate holes is further provided between the hole transport layer and the electron blocking layer, whereby it is possible to increase the transport quantity and the transport speed of holes to the emission layer and to prevent accumulation of holes between the hole transport layer and the emission layer.

In addition, the hole generation layer is formed by doping an organic material capable of performing an electron blocking function, as a host, with a p-type organic dopant having a LUMO level similar to the HOMO level of the electron blocking layer, whereby it is possible to easily withdraw electrons located at the HOMO level of the electron blocking layer, and therefore it is possible to easily transmit the generated holes through the hole generation layer and the electron blocking layer.

In addition, the p-type organic dopant of the hole generation layer includes a substituent that withdraws or pulls electrons at an end group, whereby it is possible to secure low resistance in a current path caused by holes even in an initial state in which no bias is applied and in a low current density driving state, and therefore it is possible to reduce initial turn-on voltage.

Also, in a situation in which, in a structure including a plurality of stacks, an electron transport layer having high mobility is required for a blue stack due to lower efficiency than stacks having other color emission layers, resistance in hole transmission is reduced by the provision of the hole generation layer, whereby it is possible to prevent accumulation of carriers even during low current density driving and to maintain balance in recombination between holes and electrons in the emission layer, and therefore it is possible to prevent poor visibility at low gradation.

A light emitting element according to an embodiment of the present disclosure may comprise a first electrode and a second electrode opposite each other, at least one charge generation layer between the first electrode and the second electrode and a first stack comprising a first emission layer between the first electrode and the charge generation layer, a hole transport unit comprising a hole transport layer, a hole generation layer, and an electron blocking layer sequentially between the first electrode and the first emission layer, and an electron transport layer between the first emission layer and the charge generation layer. The hole generation layer may comprise an organic host and a p-type dopant. The organic host has a LUMO level and a HOMO level different respectively from a LUMO level and a HOMO level of the electron blocking layer by 1 eV or less. The p-type dopant may have a HOMO level of −9.0 eV or less.

In a light emitting element according to an embodiment of the present disclosure, the p-type dopant has a LUMO level different from the HOMO level of the electron blocking layer by 1 eV or less.

In a light emitting element according to an embodiment of the present disclosure, the p-type dopant may be an organic material comprising a substituent that withdraws electrons at an end group.

In a light emitting element according to an embodiment of the present disclosure, the p-type dopant may have radialene as a core and comprises one or more different kinds of substituents that withdraw electrons at an end group.

In a light emitting element according to an embodiment of the present disclosure, the first stack further may comprise a hole injection layer comprising a metal fluoride between the first electrode and the hole transport layer.

In a light emitting element according to an embodiment of the present disclosure, the charge generation layer comprises an n-type charge generation layer and a p-type charge generation layer. The electron transport layer of the first stack may abut the n-type charge generation layer.

In a light emitting element according to an embodiment of the present disclosure, the hole generation layer may abut the electron blocking layer, and a thickness ratio of the hole generation layer to the electron blocking layer may be 1:4 to 1:1.

In a light emitting element according to an embodiment of the present disclosure, the organic host of the hole generation layer may be same as an organic material constituting the electron blocking layer.

In a light emitting element according to an embodiment of the present disclosure, the charge generation layer may comprise a first charge generation layer and a second charge generation layer spaced apart from each other. The light emitting element may further comprise a second stack provided between the first charge generation layer and the second charge generation layer and a third stack provided between the second charge generation layer and the second electrode. And the second stack may comprise a second emission layer and a hole transport unit provided between the first charge generation layer and the second emission layer, the hole transport unit of the second stack being identical to the hole transport unit of the first stack.

A display device to an embodiment of the present disclosure may comprise a substrate having a plurality of subpixels, a transistor at each subpixel and a light emitting element comprising a first electrode connected to the transistor at each subpixel, a second electrode opposite to the first electrode, and a plurality of stacks divided by at least one charge generation layer between the first electrode and the second electrode. A first stack of the light emitting element may comprise a first emission layer between the first electrode and the charge generation layer, a hole transport unit comprising a hole transport layer, a hole generation layer, and an electron blocking layer sequentially provided between the first electrode and the first emission layer, and an electron transport layer between the first emission layer and the charge generation layer. The hole generation layer may comprise an organic host and a p-type dopant. The organic host may has a LUMO level and a HOMO level different respectively from a LUMO level and a HOMO level of the electron blocking layer by 1 eV or less, and the p-type dopant may have a HOMO level of −9.0 eV or less.

In a display device according to an embodiment of the present disclosure, the p-type dopant may be an organic material comprising a substituent that withdraws electrons at an end group.

In a display device according to an embodiment of the present disclosure, the p-type dopant may have radialene as a core and may comprise two or more different kinds of substituents that withdraw electrons at an end group.

In a display device according to an embodiment of the present disclosure, the first stack further may comprise a hole injection layer comprising a metal fluoride between the first electrode and the hole transport layer.

In a display device according to an embodiment of the present disclosure, the charge generation layer may comprise an n-type charge generation layer and a p-type charge generation layer, and the electron transport layer of the first stack may abut the n-type charge generation layer.

In a display device according to an embodiment of the present disclosure, the hole generation layer may abut the electron blocking layer, and a thickness ratio of the hole generation layer to the electron blocking layer may be 1:4 to 1:1.

In a display device according to an embodiment of the present disclosure, the organic host of the hole generation layer may be same as the electron blocking layer.

In a display device according to an embodiment of the present disclosure, the charge generation layer may comprise a first charge generation layer and a second charge generation layer spaced apart from each other. The light emitting element may further comprise a second stack provided between the first charge generation layer and the second charge generation layer and a third stack provided between the second charge generation layer and the second electrode. And the second stack or the third stack may comprise a second emission layer and a hole transport unit provided between the first charge generation layer and the second emission layer, the hole transport unit of the second stack or the third stack being identical to the hole transport unit of the first stack.

In a display device according to an embodiment of the present disclosure, the second emission layer of the second stack or the third stack comprising the hole transport unit may emit an identical color of light to the first emission layer.

In a display device according to an embodiment of the present disclosure, the light emitting element may further comprise a third charge generation layer and a fourth stack between the second charge generation layer and the second electrode, and the fourth stack may comprise an emission layer configured to emit a different color of light from the first emission layer.

In another embodiment of the present disclosure, a light emitting element comprises a first electrode; a hole transport layer on the first electrode; a hole generation layer disposed directly on the hole transport layer; an electron blocking layer disposed directly on the hole generation layer; an emission layer on the electron blocking layer; an electron transport layer on the emission layer; and a second electrode on the electron transport layer, wherein the hole generation layer comprises an organic host and a p-type dopant, the organic host has a LUMO level and a HOMO level different from a LUMO level and a HOMO level, respectively, of the electron blocking layer by 1 eV or less, and the p-type dopant has a LUMO level different from the HOMO level of the electron blocking layer by 1 eV or less.

In a light emitting element according the another embodiment of the present disclosure, the p-type dopant may have a HOMO level of −9.0 eV or less.

In a light emitting element according the another embodiment of the present disclosure, the p-type dopant may be an organic material comprising a substituent that withdraws electrons at an end group.

In a light emitting element according the another embodiment of the present disclosure, the p-type dopant may have radialene as a core and comprises one or more different kinds of substituents that withdraw electrons at an end group.

In a light emitting element according the another embodiment of the present disclosure, a thickness ratio of the hole generation layer to the electron blocking layer may be 1:4 to 1:1.

In a light emitting element according the another embodiment of the present disclosure, the organic host of the hole generation layer may be same as an organic material constituting the electron blocking layer.

As is apparent from the above description, a light emitting element according to the present disclosure and a display device including the same have the following effects.

First, an electron blocking layer configured to primarily block electrons or excitons discharged from an emission layer to a hole transport layer is provided between the emission layer and the hole transport layer, and a hole generation layer configured to receive some discharged electrons or excitons to generate holes is further provided between the hole transport layer and the electron blocking layer, whereby it is possible to increase the transport quantity and the transport speed of holes to the emission layer and to prevent accumulation of holes between the hole transport layer and the emission layer.

Second, the hole generation layer is formed by doping an organic material capable of performing an electron blocking function, as a host, with a p-type organic dopant having a LUMO level similar to the HOMO level of the electron blocking layer, whereby it is possible to easily withdraw electrons located at the HOMO level of the electron blocking layer, and therefore it is possible to easily transmit the generated holes through the hole generation layer and the electron blocking layer.

Third, the p-type organic dopant of the hole generation layer includes a substituent that withdraws electrons at an end group, whereby it is possible to secure low resistance in a current path caused by holes even in an initial state in which no bias is applied and in a low current density driving state, and therefore it is possible to reduce initial turn-on voltage.

Fourth, in a situation in which, in a structure including a plurality of stacks, an electron transport layer having high mobility is required for a blue stack due to lower efficiency than stacks having other color emission layers, resistance in hole transmission is reduced by the provision of the hole generation layer, whereby it is possible to prevent accumulation of carriers even during low current density driving and to maintain balance in recombination between holes and electrons in the emission layer, and therefore it is possible to prevent poor visibility at low gradation.

While the embodiments of the present disclosure have been described with reference to the accompanying drawings, the present disclosure is not limited to the embodiments and may be embodied in various different forms, and those skilled in the art will appreciate that the present disclosure may be embodied in specific forms other than those set forth herein without departing from the technical idea and essential characteristics of the present disclosure. The disclosed embodiments are therefore to be construed in all aspects as illustrative and not restrictive.

What is claimed is:

1. A light emitting element comprising:

a first electrode and a second electrode;

at least one charge generation layer between the first electrode and the second electrode; and a first stack comprising a first emission layer between the first electrode and the charge generation layer, a hole transport unit comprising a hole transport layer, a hole generation layer, and an electron blocking layer sequentially between the first electrode and the first emission layer, and an electron transport layer between the first emission layer and the charge generation layer, wherein the hole generation layer comprises an organic host and a p-type dopant, the organic host has a LUMO level and a HOMO level different respectively from a LUMO level and a HOMO level of the electron blocking layer by 1 eV or less, and the p-type dopant has a HOMO level of −9.0 eV or less.

2. The light emitting element according to claim 1, wherein the p-type dopant has a LUMO level different from the HOMO level of the electron blocking layer by 1 eV or less.

3. The light emitting element according to claim 1, wherein the p-type dopant is an organic material comprising a substituent that withdraws electrons at an end group.

4. The light emitting element according to claim 1, wherein the p-type dopant has radialene as a core and comprises one or more different kinds of substituents that withdraw electrons at an end group.

5. The light emitting element according to claim 1, wherein the first stack further comprises a hole injection layer comprising a metal fluoride between the first electrode and the hole transport layer.

6. The light emitting element according to claim 1, wherein the charge generation layer comprises an n-type charge generation layer and a p-type charge generation layer, and the electron transport layer of the first stack abuts the n-type charge generation layer.

7. The light emitting element according to claim 1, wherein the hole generation layer abuts the electron blocking layer, and a thickness ratio of the hole generation layer to the electron blocking layer is 1:4 to 1:1.

8. The light emitting element according to claim 7, wherein the organic host of the hole generation layer is same as an organic material constituting the electron blocking layer.

9. The light emitting element according to claim 1, wherein the charge generation layer comprises a first charge generation layer and a second charge generation layer spaced apart from each other, the light emitting element further comprises a second stack provided between the first charge generation layer and the second charge generation layer and a third stack provided between the second charge generation layer and the second electrode, and the second stack comprises a second emission layer and another hole transport unit provided between the first charge generation layer and the second emission layer, the another hole transport unit of the second stack being identical to the hole transport unit of the first stack.

10. A light emitting element comprising:

a first electrode;

a hole transport layer on the first electrode;

a hole generation layer disposed directly on the hole transport layer;

an electron blocking layer disposed directly on the hole generation layer;

an emission layer on the electron blocking layer;

an electron transport layer on the emission layer; and a second electrode on the electron transport layer, wherein:

the hole generation layer comprises an organic host and a p-type dopant, the organic host has a LUMO level and a HOMO level different from a LUMO level and a HOMO level, respectively, of the electron blocking layer by 1 eV or less, and the p-type dopant has a LUMO level different from the HOMO level of the electron blocking layer by 1 eV or less.

11. The light emitting element according to claim 10, wherein the p-type dopant has a HOMO level of −9.0 eV or less.

12. A display device comprising:

a substrate having a plurality of subpixels;

a transistor at each subpixel; and a light emitting element comprising a first electrode connected to the transistor at each subpixel, a second electrode, and a plurality of stacks divided by at least one charge generation layer between the first electrode and the second electrode, wherein:

a first stack of the light emitting element comprises a first emission layer between the first electrode and the charge generation layer, a hole transport unit comprising a hole transport layer, a hole generation layer, and an electron blocking layer sequentially provided between the first electrode and the first emission layer, and an electron transport layer between the first emission layer and the charge generation layer, the hole generation layer comprises an organic host and a p-type dopant, the organic host has a LUMO level and a HOMO level different respectively from a LUMO level and a HOMO level of the electron blocking layer by 1 eV or less, and the p-type dopant has a HOMO level of −9.0 eV or less.

13. The display device according to claim 12, wherein the p-type dopant is an organic material comprising a substituent that withdraws electrons at an end group.

14. The display device according to claim 12, wherein the p-type dopant has radialene as a core and comprises two or more different kinds of substituents that withdraw electrons at an end group.

15. The display device according to claim 12, wherein the first stack further comprises a hole injection layer comprising a metal fluoride between the first electrode and the hole transport layer.

16. The display device according to claim 12, wherein the charge generation layer comprises an n-type charge generation layer and a p-type charge generation layer, and the electron transport layer of the first stack abuts the n-type charge generation layer.

17. The display device according to claim 12, wherein the hole generation layer abuts the electron blocking layer, and a thickness ratio of the hole generation layer to the electron blocking layer is 1:4 to 1:1.

18. The display device according to claim 17, wherein the organic host of the hole generation layer is same as the electron blocking layer.

19. The display device according to claim 12, wherein the charge generation layer comprises a first charge generation layer and a second charge generation layer spaced apart from each other, the light emitting element further comprises a second stack provided between the first charge generation layer and the second charge generation layer and a third stack provided between the second charge generation layer and the second electrode, and the second stack or the third stack comprises a second emission layer and another hole transport unit provided between the first charge generation layer and the second emission layer, the another hole transport unit of the second stack or the third stack being identical to the hole transport unit of the first stack.

20. The display device according to claim 19, wherein the second emission layer of the second stack or the third stack comprising the another hole transport unit emits an identical color of light to the first emission layer.

21. The display device according to claim 19, wherein the light emitting element further comprises a third charge generation layer and a fourth stack between the second charge generation layer and the second electrode, and the fourth stack comprises a fourth emission layer configured to emit a different color of light from the first emission layer.

* * * * *